(12) United States Patent
Prager et al.

(10) Patent No.: US 10,320,373 B2
(45) Date of Patent: Jun. 11, 2019

(54) RF PRODUCTION USING NONLINEAR SEMICONDUCTOR JUNCTION CAPACITANCE

(71) Applicant: Eagle Harbor Technologies, Inc., Seattle, WA (US)

(72) Inventors: James R. Prager, Seattle, WA (US); Timothy M. Ziemba, Bainbridge Island, WA (US); Kenneth E. Miller, Seattle, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 253 days.

(21) Appl. No.: 15/465,266

(22) Filed: Mar. 21, 2017

(65) Prior Publication Data

US 2018/0102769 A1 Apr. 12, 2018

Related U.S. Application Data

(60) Provisional application No. 62/406,710, filed on Oct. 11, 2016.

(51) Int. Cl.
*H03K 5/12* (2006.01)
*H03H 11/02* (2006.01)

(52) U.S. Cl.
CPC ............... *H03K 5/12* (2013.01); *H03H 11/02* (2013.01)

(58) Field of Classification Search
CPC ............ H03K 3/017; H03K 3/02; H03K 3/36; H03K 3/57; H03K 5/04; H03K 5/12; H03K 17/56
USPC .......................................... 333/20
See application file for complete search history.

(56) References Cited

PUBLICATIONS

Smith, "High Power, Pulsed, RF generation from Nonlinear Lumped Element Transmission Lines (NLETL's)", Oxford University, Oxford, UK, May 2011, pp. 161-205. (Year: 2011).*
Baker et al. "Generation of kilovolt-sub-nanosecond pulses using a nonlinear transmission line", Design Note in Measurement Science Technology, vol. 4 (May 1993), pp. 893-895 (Year: 1993).*

* cited by examiner

*Primary Examiner* — Benny T Lee
*Assistant Examiner* — Hafizur Rahman

(57) ABSTRACT

Some embodiments include a high voltage nonlinear transmission line comprising a high voltage input configured to receive electrical pulses having a first peak voltage that is greater than 10 kV; a plurality of circuit elements electrically coupled with ground, each of the plurality of circuit elements includes a nonlinear semiconductor junction capacitance device; a plurality of inductors, at least one of the plurality of inductors is electrically coupled between two circuit elements of the plurality of circuit elements; and a high voltage output providing a high voltage output signal that oscillates at a frequency greater than 100 MHz about a voltage greater than 10 kV.

17 Claims, 10 Drawing Sheets

RF PRODUCTION USING NONLINEAR SEMICONDUCTOR JUNCTION CAPACITANCE

BACKGROUND

Producing high power microwave pulses is challenging due to the high voltages and high frequencies involved.

SUMMARY

Some embodiments include a high voltage nonlinear transmission line comprising a high voltage input configured to receive electrical pulses having a first peak voltage that is greater than 10 kV; a plurality of circuit elements electrically coupled with ground, each of the plurality of circuit elements includes a nonlinear semiconductor junction capacitance device; a plurality of inductors, at least one of the plurality of inductors is electrically coupled between two circuit elements of the plurality of circuit elements; and a high voltage output providing a high voltage output signal that oscillates at a frequency greater than 100 MHz about a voltage greater than 10 kV.

In some embodiments, each of the nonlinear semiconductor junction capacitance devices have a capacitance that changes nonlinearly with voltage.

In some embodiments, the high voltage output signal has a second rise time that is faster than a first rise time of the high voltage input.

In some embodiments, each of the plurality of inductors has an inductance less than about 500 nH.

In some embodiments, each of the plurality of nonlinear semiconductor junction capacitance devices have an inductance less than about 100 nH.

In some embodiments, each of the nonlinear semiconductor junction capacitance devices may be a capacitor, a diode, a solid-state switch, or any semiconductor junction found in a solid-state device.

In some embodiments, the plurality of circuit elements comprises at least 30 circuit elements.

In some embodiments, each of the nonlinear semiconductor junction capacitance devices comprises a plurality of nonlinear semiconductor junction capacitance devices arranged in parallel and/or series.

In some embodiments, wherein each of the plurality of nonlinear semiconductor junction capacitance devices have a capacitance at zero volts less than about 5 nF.

Some embodiments include a nonlinear transmission line comprising a high voltage input configured to receive electrical pulses having a first peak voltage that is greater than 5 kV having a first rise time; a first nonlinear semiconductor junction capacitance device; and a second nonlinear semiconductor junction capacitance device; and a first inductor electrically coupled with the first nonlinear semiconductor junction capacitance device and the second nonlinear semiconductor junction capacitance device; a third nonlinear semiconductor junction capacitance device; and a second inductor electrically coupled with the second nonlinear semiconductor junction capacitance device and the third nonlinear semiconductor junction capacitance device; a fourth nonlinear semiconductor junction capacitance device; and a third inductor electrically coupled with the third nonlinear semiconductor junction capacitance device and the fourth nonlinear semiconductor junction capacitance device; a fifth nonlinear semiconductor junction capacitance device; and a fourth inductor electrically coupled with the fourth nonlinear semiconductor junction capacitance device and the fifth nonlinear semiconductor junction capacitance device; a high voltage output providing a high voltage output signal that oscillates at a frequency greater than 100 MHz about a voltage greater than 5 kV. In some embodiments, the nonlinear transmission line may include a fifth inductor electrically coupled with the fifth nonlinear semiconductor junction capacitance device and the high voltage output.

In some embodiments, the high voltage output comprises an antenna.

In some embodiments, the first inductor, the second inductor, the third inductor, the fourth inductor, and the fifth inductor have substantially the same inductance.

In some embodiments, at least two of the first inductor, the second inductor, the third inductor, the fourth inductor, and the fifth inductor have different inductance.

In some embodiments, the first nonlinear semiconductor junction capacitance device, the second nonlinear semiconductor junction capacitance device, the third nonlinear semiconductor junction capacitance device, the fourth nonlinear semiconductor junction capacitance device, and/or the fifth nonlinear semiconductor junction capacitance device each have a stray inductance less than about 100 nH.

In some embodiments, the first inductor, the second inductor, the third inductor, the fourth inductor, and the fifth inductor each have an inductance less than about 500 nH.

BRIEF DESCRIPTION OF THE FIGURES

These and other features, aspects, and advantages of the present disclosure are better understood when the following Detailed Description is read with reference to the accompanying drawings.

DISCLOSURE

Figure 1:
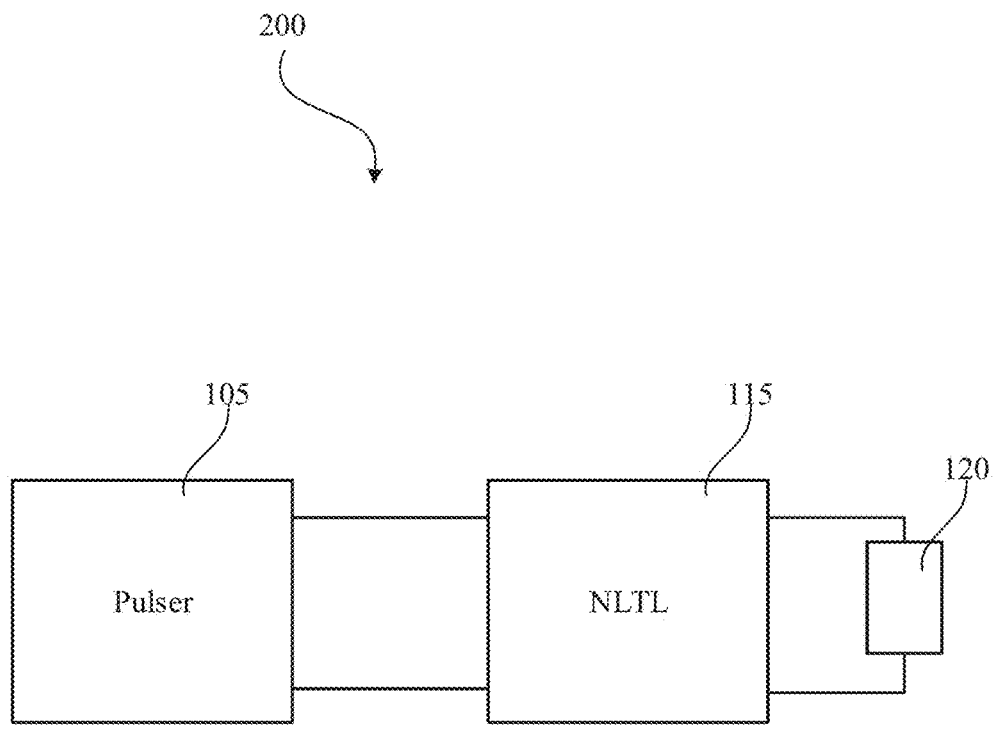
FIG. 1 is a block diagram of a nonlinear transmission line microwave generation device using a nonlinear transmission line according to some embodiments.

A nonlinear transmission line microwave generation device is disclosed. In some embodiments, the nonlinear transmission line may include a plurality of nonlinear semiconductor junction capacitance devices (e.g., nonlinear capacitors). In some embodiments, the nonlinear transmission line may sharpen the rise time of a high voltage input pulse that may, for example, have a variable pulse width and/or a high pulse repetition rate. In some embodiments, the rise time of the input pulse become sharper and sharper as it propagates through the elements of the nonlinear transmission line the output may begin to ring producing a high frequency RF signal.

Some embodiments of the invention include the use of a nonlinear semiconductor junction capacitance device. A nonlinear semiconductor junction capacitance device in some voltage regimes may have a capacitance that varies as voltage across the nonlinear semiconductor junction capacitance device.

A nonlinear semiconductor junction can include a P-type or an N-type junction. A semiconductor junction defined by the boundary between regions of P-type and N-type conductivity material is a capacitor under certain conditions. This junction capacitance arises from the electrical charge of the depletion layer or space-charge region associated with the junction. The space-charge region identifies a volume adjoining the junction on both sides within which the net fixed charge arising from the presence of ionized impurity atoms is not neutralized by mobile charge carriers. Outside of the depletion layer the mobile carriers, holes in the P-type material and electrons in the N-type, are present in almost exactly the right numbers to neutralize the fixed charges.

If the junction is biased slightly in the forward or reverse direction by applying a voltage to a contact on one side of the junction, this voltage urges the hole and electron distributions to move toward or away from each other, respectively. Additional holes and electrons enter or leave the semiconductor at the contacts to maintain the neutrality of the P-type and N-type regions as the depletion layer narrows or widens. Therefore, a certain amount of charge is introduced at the terminals of the device and, neglecting recombination or generation of charge carriers, the same amount of charge returns if the applied voltage is changed back to zero. Thus, the semiconductor junction device is like a capacitor. The relation between the applied voltage and the amount of charge introduced at the terminals is nonlinear; i.e. the capacitance, defined as the rate of change of charge as voltage is changed, depends upon the voltage.

A nonlinear semiconductor junction can also include a metal-semiconductor junction in which a metal is in close contact with a semiconductor material. This close contact between the metal and the semiconductor material can create a junction capacitance that may vary with applied voltage. A metal-semiconductor junction can be referred to as a Schottky barrier diode, Schottky barrier junction, or a point contact diode. A metal-semiconductor junction may include, for example, a metal with either a P-type or an N-type semiconductor region.

In some embodiments, a nonlinear semiconductor junction ("NSJC") device may be a capacitor or a number of plurality of capacitors. In some embodiments, a NSJC device may include two parallel conductors (or a capacitor) etched on a circuit board.

A nonlinear transmission line may include a plurality of circuit elements that each include at least one inductor and at least one NSJC device such as, for example, a capacitor. The speed at which the input pulse propagates the nonlinear transmission line changes as a function of voltage. Thus, the high voltage components of the input pulse propagate down the line faster than the slow voltage components of the input pulse. This can lead to a sharpening of the rising edge of the pulse as it propagates down the line. Each element changes by an element, $\Delta t_{element}$, of the rise time by approximately:

$$\Delta t_{element} \sim \sqrt{LC(V_{10\%})} - \sqrt{LC(V_{90\%})}.$$

The nonlinear transmission line may sharpen the rising edge of an input pulse sufficiently that a shock at the output from the nonlinear transmission line may form and the output begins to ring producing a high frequency output signal.

FIG. 1 is a block diagram of a system having a high voltage pulser 105 and a nonlinear transmission line 115 according to some embodiments. The system may or may not also include an antenna 120 coupled with the output of the nonlinear transmission line 115. In some embodiments, for example, a floating output of the high voltage pulser 105 can be electrically coupled with the nonlinear transmission line 115. In some embodiments, the antenna may output an RF signal that oscillates with a frequency of 100 MHz-30 GHz. In some embodiments, the antenna may output an RF signal that oscillates around any voltage such as, for example, 0 volts, 1 kV, 5 kV, 10 kV, 20 kV, etc.

The high voltage pulser 105 may include, for example, a plurality of solid state switches (e.g., IGBTs, MOSFETs, FETs, SiC, GaN switches) and/or a transformer. The high voltage pulser 105 may, for example, be designed and/or constructed with low stray inductance and/or low stray capacitance. The high voltage pulser 105 may, for example, may produce high voltage pulses having a fast rise time, a high voltage (e.g., greater than 1 kV), a variable pulse width, a high repetition rate, etc. Any type of high voltage pulser may be used. The high voltage pulser 105 may include the high voltage nanosecond pulser described in U.S. Patent Publication 2015/0130525 and/or U.S. Patent Publication 2015/0318846 the entirety of each of which are incorporated by reference for disclosing a pulser 105.

In some embodiments, the high voltage pulser 105 may, for example, operate with variable pulse widths, voltages greater than 1 kV (or even up to 100 kV), and/or a pulse repetition frequency of 10 kHz-100 kHz.

In some embodiments, the high voltage pulser 105 may operate in a single pulse regime, or in a regime with long pulses.

The nonlinear transmission line 115, for example, may sharpen the rise time of one or more high voltage pulses (e.g., decrease the rise time, speed up the rise time, etc.) produced by the high voltage pulser 105 to the point where the output rings. The nonlinear transmission line 115 may include the nonlinear transmission line 200, 300, 300, 600 or some variation thereof.

In some embodiments, the antenna 120 may propagate a high voltage, electromagnetic microwave signal. In some embodiments, the antenna 120 may have an impedance less than about 500, 250, 100, 75, 50, 25, etc. ohms. In some embodiments, the antenna may have an impedance that is matched with the pulser 105.

Figure 2:
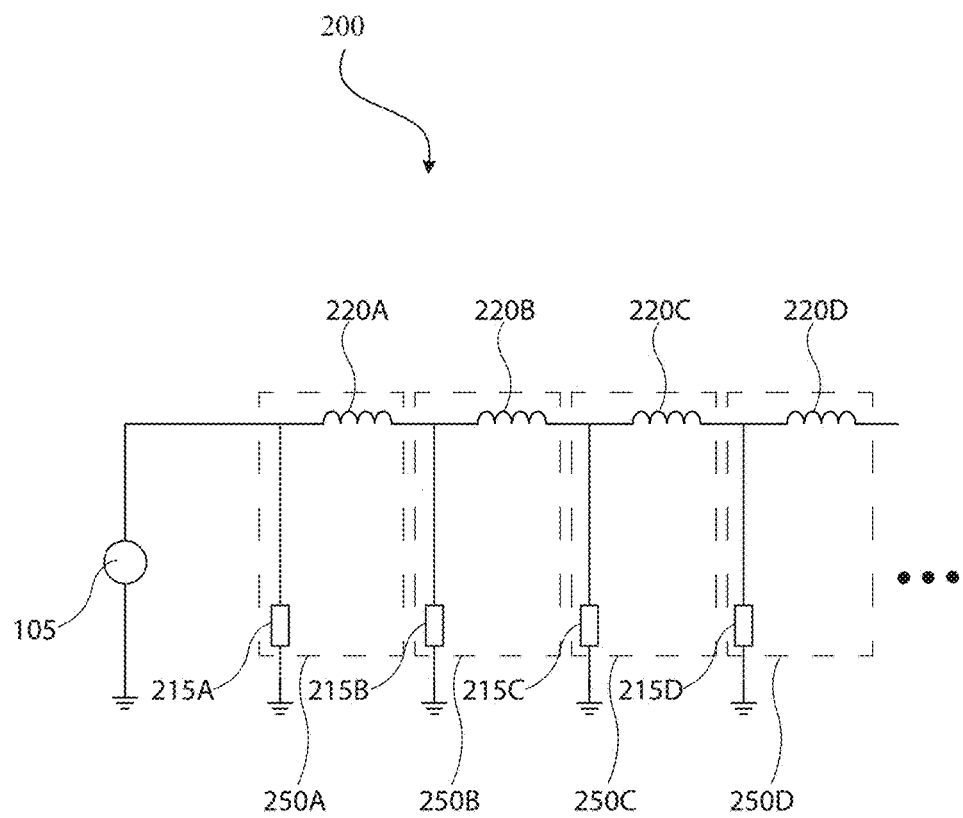
FIG. 2 is a circuit diagram of a nonlinear transmission line according to some embodiments.

FIG. 2 is a circuit diagram of a nonlinear transmission line 200 according to some embodiments. The nonlinear transmission line 200 may include an input that can connect to a high voltage pulser 105. In some embodiments, a high voltage pulser may include the nonlinear transmission line 200.

The nonlinear transmission line 200 includes a first circuit element 250A that includes a first NSJC device 215A and a first inductor 220A. The first circuit element 250A may be electrically coupled to both the high voltage pulser 105 and ground.

The nonlinear transmission line 200 includes a second circuit element 250B that includes a second NSJC device 215B and a second inductor 220B. The second circuit element 250B may be electrically coupled to both the first inductor 220A and ground.

The nonlinear transmission line 200 includes a third circuit element 250C that includes a third NSJC device 215C and a third inductor 220C. The third circuit element 250C may be electrically coupled to both the second inductor 220B and ground.

The nonlinear transmission line 200 includes a fourth circuit element 250D that includes a fourth NSJC device 215D and a fourth inductor 220D. The fourth circuit element 250D may be electrically coupled to both the third inductor 220C and ground.

The nonlinear transmission line 200 may include an output that is connected with an antenna that can radiate a high voltage microwave signal.

The nonlinear transmission line 200 shown in FIG. 2 shows four circuit elements (each having an inductor and an NSJC device). Any number of circuit elements and/or inductors may be included. For example, a nonlinear transmission line may include ten or more circuit elements and/or inductors. As another example, a nonlinear transmission line may include forty or more circuit elements and/or inductors.

In some embodiments, each NSJC device (e.g., NSJC device 215A, 215B, 215C, 215D, etc.) may have an inductance or a stray inductance less than about 500 nH, 250 nH, 100 nH. 50 nH, 25 nH, etc. In some embodiments, each NSJC device (e.g., NSJC device 215A, 215B, 215C, 215D, etc.) may include a plurality of NSJC device in series or parallel.

In some embodiments, each NSJC device (e.g., NSJC device 215A, 210B, 210C, 210D, etc.) may have a zero voltage capacitance (e.g., the capacitance measured when no voltage is applied to the NSJC device) less than about 10 nF, 1 nF, 500 pF, 250 pF, 100 pF, 50 pF, 25 pF, etc.

In some embodiments, each inductor (e.g., inductor 220A, 220B, 220C, 220D, etc.) may have an inductance less than about 500 nH, 250 nH, 100 nH. 50 nH, 25 nH, etc. In some embodiments, each inductor (e.g., inductor 220A, 220B, 220C, 220D, etc.) may include a plurality of inductors arranged in series or parallel.

Figure 3:
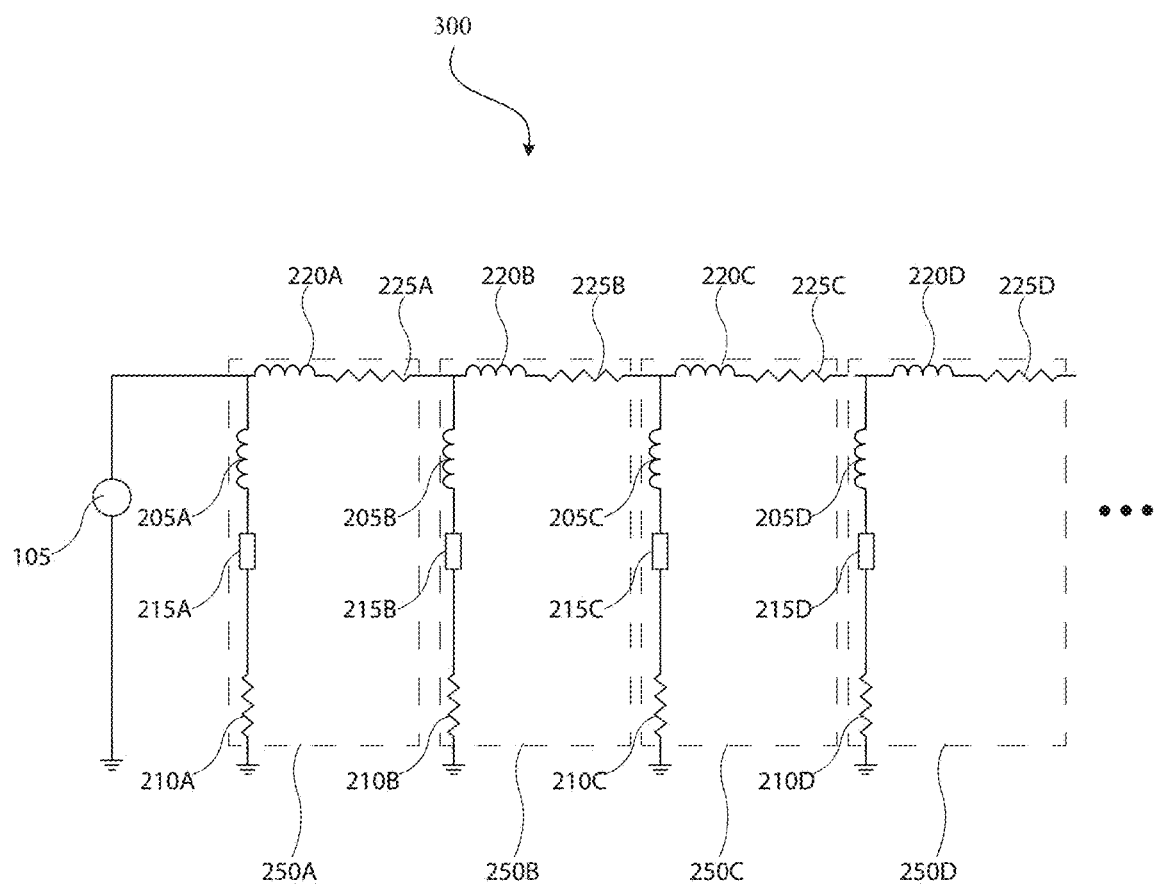
FIG. 3 is a circuit diagram of a nonlinear transmission line according to some embodiments.

FIG. 3 is a circuit diagram of a nonlinear transmission line 300 according to some embodiments. The circuit diagram of the nonlinear transmission line 300 shows a number of stray elements such as stray resistance represented as a resistor and stray inductance represented as an inductor.

The nonlinear transmission line 300 includes a first circuit element 250A that includes a first NSJC device 215A and first inductor 220A. The first circuit element 250A may also include stray inductance, which is schematically represented by inductor 205A. In some embodiments, the stray inductance represented by inductor 205A can represent all or most of the stray inductance of the first circuit element 250A, such as, for example, the inductance of traces in the circuit element, inductance of the NSJC device, etc. The first circuit element 250A may also include stray resistance, which can be schematically represented by resistors 210A and 225A. In some embodiments, the stray resistance represented by resistors 210A and 225A can represent all or most of the stray resistance of the first circuit element 250A such as, for example, the resistance of traces in the circuit element, resistance of the NSJC device, etc.

The nonlinear transmission line 300 includes a second circuit element 250B that includes a second NSJC device 215B and second inductor 220B. The second circuit element 250B may also include stray inductance, which is schematically represented by inductor 205B. In some embodiments, the stray inductance represented by inductor 205B can represent all or most of the stray inductance of the second circuit element 250B, such as, for example, the inductance of traces in the circuit element, inductance of the NSJC device, etc. The second circuit element 250B may also include stray resistance, which can be schematically represented by resistors 210B and 225B. In some embodiments, the stray resistance represented by resistors 210B and 225B can represent all or most of the stray resistance of the second circuit element 250B.

The nonlinear transmission line 300 includes a third circuit element 250C that includes a third NSJC device 215C and third inductor 220C. The third circuit element 250C may also include stray inductance, which is schematically represented by inductor 205C. In some embodiments, the stray inductance represented by inductor 205C can represent all or most of the stray inductance of the third circuit element 250C, such as, for example, the inductance of traces in the circuit element, inductance of the NSJC device, etc. The third circuit element 250C may also include stray resistance, which can be schematically represented by resistors 210C and 225C. In some embodiments, the stray resistance represented by resistors 210C and 225C can represent all or most of the stray resistance of the third circuit element 250C such as, for example, the resistance of traces in the circuit element, resistance of the NSJC device, etc.

The nonlinear transmission line 300 includes a fourth circuit element 250D that includes a fourth NSJC device 215D and fourth inductor 220D. The fourth circuit element 250D may also include stray inductance, which is schematically represented by inductor 205D. In some embodiments, the stray inductance represented by inductor 205D can represent all or most of the stray inductance of the fourth circuit element 250D, such as, for example, the inductance of traces in the circuit element, inductance of the NSJC device, etc. The fourth circuit element 250D may also include stray resistance, which can be schematically represented by resistors 210D and 225D. In some embodiments, the stray resistance represented by resistors 210D and 225D can represent all or most of the stray resistance of the fourth circuit element 250D such as, for example, the resistance of traces in the circuit element, resistance of the NSJC device, etc.

In some embodiments, each one of the plurality of inductors 220A, 220B, 220C, 220D may have a value greater than a respective stray inductance represented by each or any one of inductors 205A, 205B, 205C, 205D.

In some embodiments, the stray resistance represented by resistors 210A, 210B, 210C, 210D may have a resistance less than about 5.0, 2.5, 1.0, 0.5, etc. ohms. In some embodiments, the stray resistance represented by resistors 210A, 210B, 210C, 210D may be minimized. In some embodiments, the stray resistance represented by resistors 210A, 210B, 210C, 210D may include, for example, the internal resistance of the NSJC device and/or any of its connections. In some embodiments, the stray resistance represented by resistors 210A, 210B, 210C, 210D may comprise the resistance of a wire, a trace, a plurality of wires, a plurality of traces, litz wire, etc.

In some embodiments, the stray resistance represented by resistors 225A, 225B, 225C, 225D may be as small as possible. In some embodiments, the stray resistance represented by resistors 225A, 225B, 225C, 225D may be as minimized. In some embodiments, the stray resistance represented by resistors 225A, 225B, 225C, 225D may comprise the resistance of a wire, a trace, a plurality of wires, a plurality of traces, litz wire, etc.

While the transmission line 300 shown in FIG. 3 shows four circuit elements any number of circuit elements may be used. In some embodiments, each NSJC device 215A, 215B, 215C, or 215D may include one or more NSJC devices in series or parallel (e.g., 2, 3, 5, 7, 9, 12, 15 diodes arranged in series), which may, for example, provide for a NSJC device combination with sufficient operating voltage such as, for example, a combined operating voltage greater than 500 V, 1 kV, 2.5 kV, 5 kV, 10 kV, etc. In some embodiments, each NSJC device 215A, 215B, 215C, or 215D may comprise one or more Schottky diode such as, for example, silicon carbide Schottky diode(s), silicon diodes, or other devices such as, for example, a solid-state switch, FET, MOSFET, IGBT, GaN, SiC, MOSFET, etc.

Each NSJC device 215A, 215B, 215C, or 215D (or combination of diodes), for example, may have a voltage ratings of more than 1.0 kV such as, for example, 1.1, 1.2, 1.3, 1.4, 1.5, 1.6, 1.8, 1.9, 2.0, 2.1, 2.2, 2.3, 3.4 kV. In some embodiments, each NSJC device 215A, 215B, 215C, or 215D (or combination of diodes) may have a respective stray inductance 205A, 205B, 205C, 205D less than about 1,000 nH, 750 nH, 500 nH, 250 nH, 100 nH, 50 nH, 30 nH, 20 nH, 15 nH, 10 nH, etc.

While the nonlinear transmission line 300 shown in FIG. 3 shows four inductors 220A, 220B, 220C, 220D any number of inductors may be used. The inductors, for example, may have an inductance less than about 250 nH, 100 nH, 50 nH, 25 nH, 10 nH, etc.

In some embodiments, the nonlinear transmission line 300 may be coupled with a nanosecond pulser that can produce a high voltage pulse train with a plurality of pulses. The high voltage pulse train produced by the nanosecond pulser may have any number of characteristics such as, for example, having a voltage such as, for example, above 1 kV, 2.5 kV, 5 kV, 10 kV, 15 kV, 20 kV, etc.; and a fast rise time such as, for example, a rise time less than about 50 ns, 40 ns, 30 ns, 20 ns, 10 ns, etc., etc. The plurality of pulses of the high voltage pulse train may, for example, have variable pulse widths (e.g., 3-275 ns).

Figure 4:
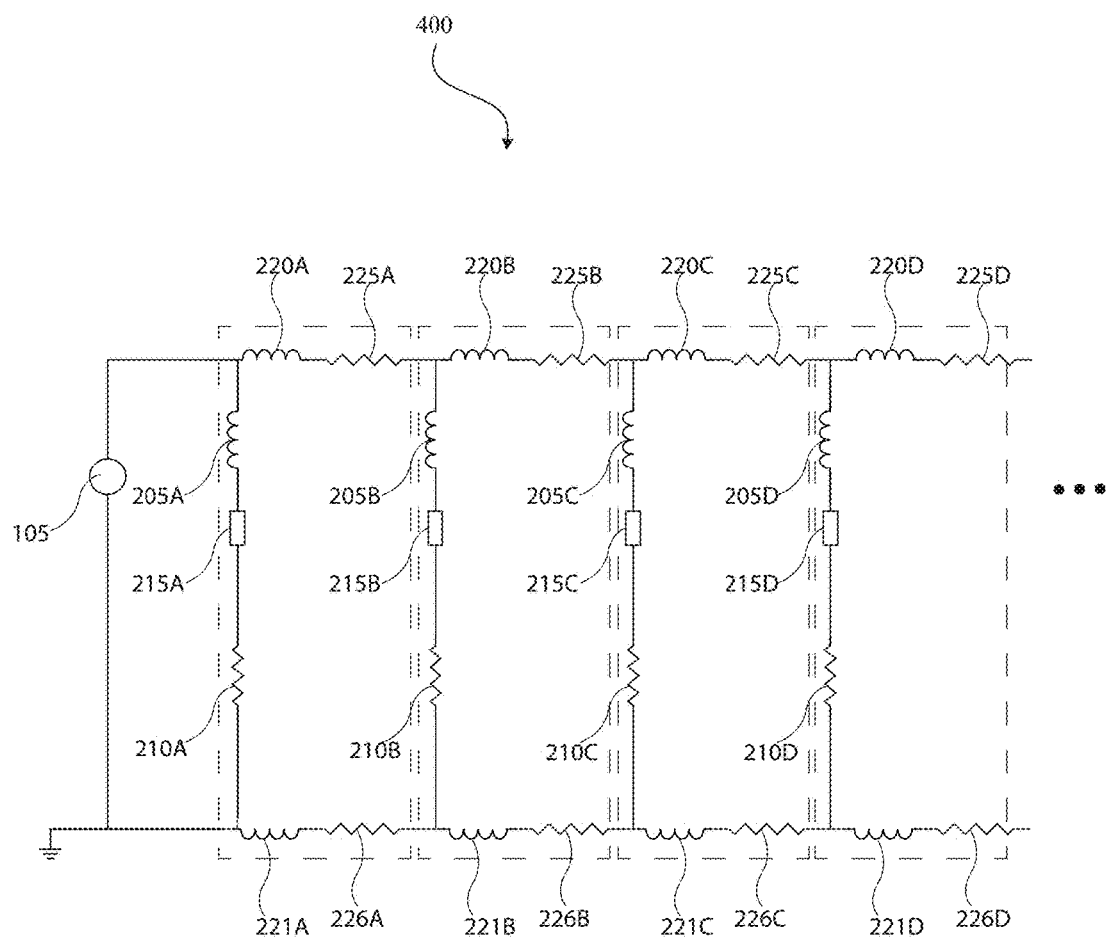
FIG. 4 is a circuit diagram of a nonlinear transmission line according to some embodiments.

FIG. 4 is a circuit diagram of a nonlinear transmission line 400 according to some embodiments. The circuit diagram of the nonlinear transmission line 400 shows a number of stray elements such as stray resistance represented as a resistor and stray inductance represented as an inductor. In addition, the circuit diagram of the nonlinear transmission line 400 includes two inductors within each circuit element.

In some embodiments, the nonlinear transmission line 400 may include a plurality circuit elements that each include a NSJC device. In this example, each circuit element includes two inductors.

The nonlinear transmission line 400 includes a first circuit element 250A that includes a first NSJC device 215A, a first upper inductor 220A, and a first lower inductor 221A. The first circuit element 250A may also include stray inductance, which is schematically represented by inductor 205A. In some embodiments, the stray inductance represented by inductor 205A can represent all or most of the stray inductance of the first circuit element 250A, such as, for example, the inductance of traces in the circuit element, inductance of the NSJC device, etc. The first circuit element 250A may also include stray resistance, which can be schematically represented by resistors 21 OA, 225A, and 226A. In some embodiments, the stray resistance represented by resistors 21 OA, 225A, and 226A can represent all or most of the stray resistance of the first circuit element 250A such as, for example, the resistance of traces in the circuit element, resistance of the NSJC device, etc.

The nonlinear transmission line 400 includes a second circuit element 250B that includes a second NSJC device 215B, second lower inductor 220B, and second upper inductor 221B. The second circuit element 250B may also include stray inductance, which is schematically represented by inductor 205B. In some embodiments, the stray inductance represented by inductor 205B can represent all or most of the stray inductance of the second circuit element 250B, such as, for example, the inductance of traces in the circuit element, inductance of the NSJC device, etc. The second circuit element 250B may also include stray resistance, which can be schematically represented by resistors 210B, 225B, and 226B. In some embodiments, the stray resistance represented by resistors 210B, 225B, and 226B can represent all or most of the stray resistance of the second circuit element 250B such as, for example, the resistance of traces in the circuit element, resistance of the NSJC device, etc.

The nonlinear transmission line 400 includes a third circuit element 250C that includes a third NSJC device 215C, third lower inductor 220C, and third upper inductor 221C. The third circuit element 250C may also include stray inductance, which is schematically represented by inductor 205C. In some embodiments, the stray inductance represented by inductor 205C can represent all or most of the stray inductance of the third circuit element 250C, such as, for example, the inductance of traces in the circuit element, inductance of the NSJC device, etc. The third circuit element 250C may also include stray resistance, which can be schematically represented by resistors 210C, 225C, and 226C. In some embodiments, the stray resistance represented by resistors 210C, 225C, and 226C can represent all or most of the stray resistance of the third circuit element 250C such as, for example, the resistance of traces in the circuit element, resistance of the NSJC device, etc.

The nonlinear transmission line 400 includes a fourth circuit element 250D that includes a fourth NSJC device 215D, fourth lower inductor 220D, and fourth upper inductor 221D. The fourth circuit element 250D may also include stray inductance, which is schematically represented by inductor 205D. In some embodiments, the stray inductance represented by inductor 205D can represent all or most of the stray inductance of the fourth circuit element 250D, such as, for example, the inductance of traces in the circuit element, inductance of the NSJC device, etc. The fourth circuit element 250D may also include stray resistance, which can be schematically represented by resistors 210A, 225D, and 226D. In some embodiments, the stray resistance represented by resistors 210D, 225D, and 226D can represent all or most of the stray resistance of the fourth circuit element 250D such as, for example, the resistance of traces in the circuit element, resistance of the NSJC device, etc.

In some embodiments, an inductor pair, for example, inductor pairs 220A and 221A, 220B and 221B, 220C and 221C, 220D and 221D may be electrically coupled between two circuit elements and/or a circuit element and an output. In some embodiments, each one of the plurality of inductors 220A, 220B, 220C, 220D, 221A, 221B, 221C, 221D, may have a value greater than a respective stray inductance represented by one of inductors 205A, 205B, 205C, 205D.

In some embodiments, the stray resistance represented by resistors 210A, 210B, 210C, 210D may have a resistance less than about 5.0, 2.5, 1.0, 0.5, etc. ohms. In some embodiments, the stray resistance represented by resistors 210A, 210B, 210C, 210D may be minimized. In some embodiments, the stray resistance represented by resistors 210A, 210B, 210C, 210D may comprise the resistance of a wire, a trace, a plurality of wires, a plurality of traces, litz wire, etc.

While the transmission line 400 shown in FIG. 4 shows four circuit elements any number of circuit elements may be used. In some embodiments, each NSJC device 215A, 215B, 215C, 215D may include one or more NSJC devices in The following table provides some example values for a nonlinear transmission line that can be used to create high voltage microwave pulses at various frequencies. In some embodiments, each value may range from the 25% below the listed LF ("Low Frequency") value to 25% above the listed HF ("High Frequency") value.

| Variable | Description | LF Value | HF Value |
|---|---|---|---|
| $C_{j0}$ | Junction capacitance at zero voltage | 1.3856 nF | 173.2 pF |
| $\varphi$ | | 1.75 V | 1.75 V |
| m | For a silicon carbide (SiC) device | 0.5 | 0.5 |
| $L_{stray}$ | Stray inductance (205.) | 100 pH | 100 pH |
| L | Inductance (220.) | 48 nH | 6 nH |
| $R_L$ | Stray resistance in inductor leg (225) | 100 m$\Omega$ | 10 m$\Omega$ |
| $R_C$ | Stray resistance in capacitor leg (210) | 100 m$\Omega$ | 10 m$\Omega$ |
| N | Number of elements | 30 | 140 |
| $f_{RF}$ | Measured RF frequency | 325 MHz | 2.4 GHz |
| $\omega_{RF}$ | RF angular frequency | $2.0 \times 10^9$ s$^{-1}$ | $15.1 \times 10^9$ s$^{-1}$ |
| $\omega_{Bragg}$ | Bragg cutoff frequency | $2.13 \times 10^9$ s$^{-1}$ | $17.1 \times 10^9$ s$^{-1}$ | series or parallel (e.g., 2, 3, 5, 7, 9, 12, 15 diodes arranged in series), which may, for example, provide for a NSJC device combination with sufficient operating voltage such as, for example, a combined operating voltage greater than 500 V, 1 kV, 2.5 kV, 5 kV, 10 kV, etc. In some embodiments, each NSJC device 215A, 215B, 215C, or 215D may comprise one or more Schottky diode such as, for example, silicon carbide Schottky diode(s), silicon diodes, or other.

In some embodiments, each NSJC device 215A, 215B, 215C, or 215D (or combination of diodes), for example, may have a voltage ratings of more than 1.0 kV such as, for example, 1.1, 1.2, 1.3, 1.4, 1.5, 1.6, 1.8, 1.9, 2.0, 2.1, 2.2, 2.3, 3.4 kV. In some embodiments, each NSJC device 215A, 215B, 215C, or 215D (or combination of diodes) may have a respective stray inductance 205A, 205B, 205C, 205D less than about 1,000 nH, 750 nH, 500 nH, 250 nH, 100 nH, 50 nH, 30 nH, 20 nH, 15 nH, 10 nH, etc.

While the nonlinear transmission line 400 shown in FIG. 4 shows four inductor pairs 220A and 221A, 220B and 221B, 220C and 221C, 220D and 221D any number of inductors may be used. The inductors 220A, 220B, 220C, 220D, for example, may have an inductance less than about 250 nH, 100 nH, 50 nH, 25 nH, 10 nH, etc.

In some embodiments, the nonlinear transmission line 400 may be coupled with a nanosecond pulser that can produce a high voltage pulse train with a plurality of pulses. The high voltage pulse train produced by the nanosecond pulser may have any number of characteristics such as, for example, having a voltage such as, for example, above 1 kV, 2.5 kV, 5 kV, 10 kV, 15 kV, 20 kV, etc.; and a fast rise time such as, for example, a rise time less than about 50 ns, 40 ns, 30 ns, 20 ns, 10 ns, etc., etc. The plurality of pulses of the high voltage pulse train may, for example, have variable pulse widths (e.g., 3-275 ns).

In some embodiments, a nonlinear transmission line can include a NSJC device that has the following capacitance:

$$C(V) = \frac{C_{j0}}{(1 + V/\varphi)^m}.$$

Where $C_{j0}$ is the junction capacitance of the NSJC at zero voltage. V is the voltage. $\varphi$ is the junction potential. m is a constant value between 0.25 and 0.75 that varies based on the type of NSJC.

Figure 5:
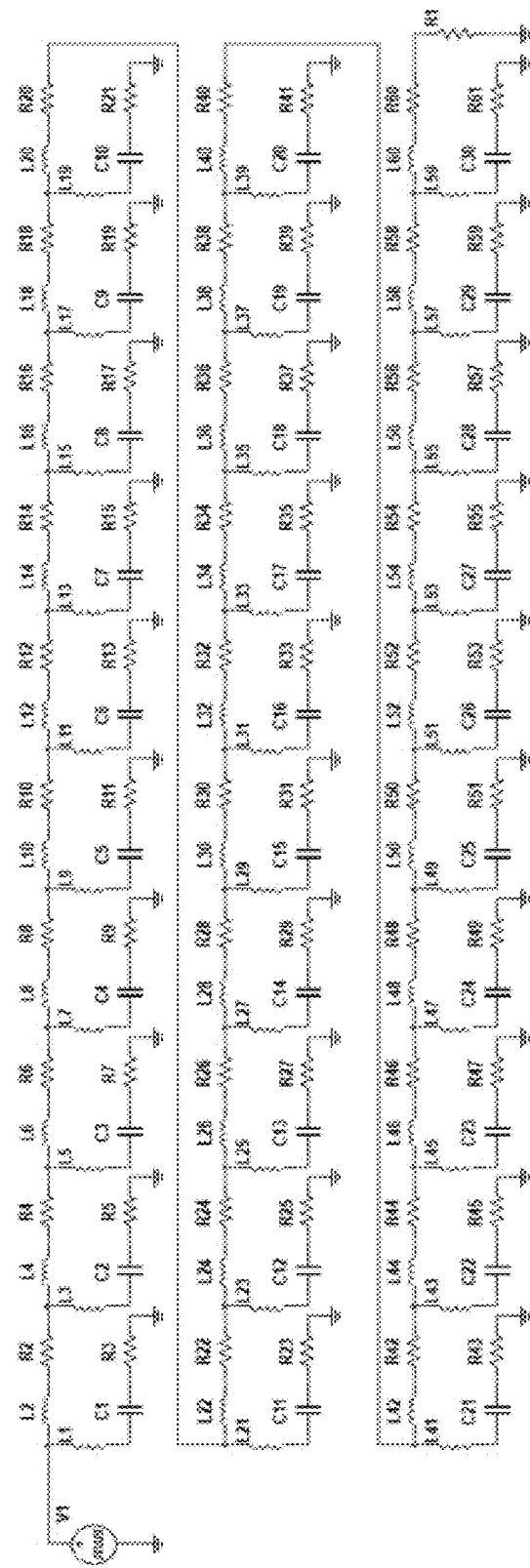
FIG. 5 is a circuit diagram of a nonlinear transmission line according to some embodiments.
Figure 6:
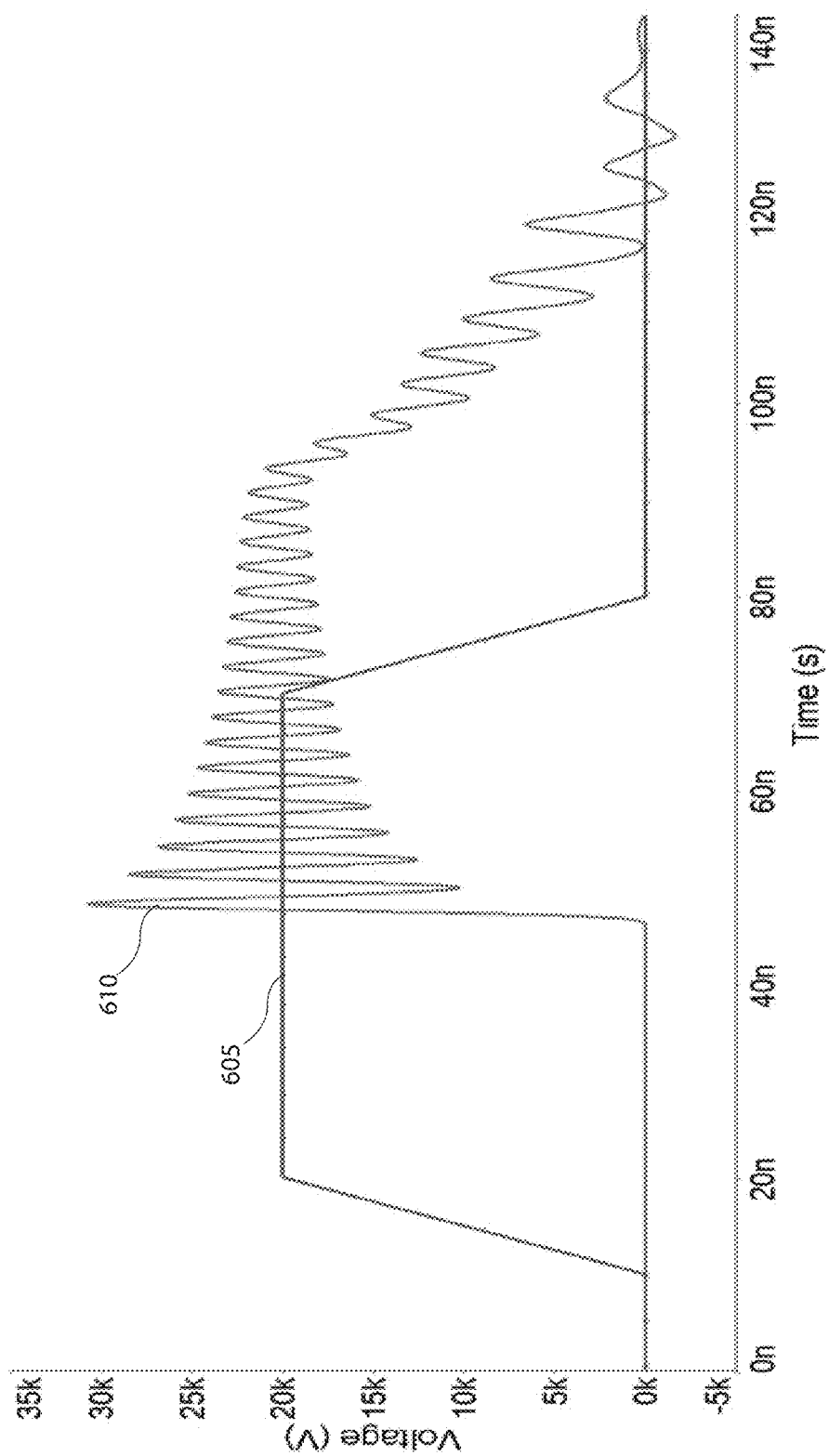
FIG. 6 is an input and output waveform of a nonlinear transmission line microwave generation device according to some embodiments.

FIG. 5 is a circuit diagram a nonlinear transmission line 500 with 30 circuit elements according to some embodiments. FIG. 6 is a diagram of an input pulse 605 from a high voltage pulser 105 and an output pulse 610 after propagating through the nonlinear transmission line 500 shown in FIG. 5. As shown in the diagram, the input pulse 605 is 20 kV pulse with a 60 ns flat top and a rise time of 10 ns. The output pulse is a high voltage signal with a frequency of 325 MHz. The various elements in the nonlinear transmission line 500 may have the LF Values listed in the table above.

Figure 7:
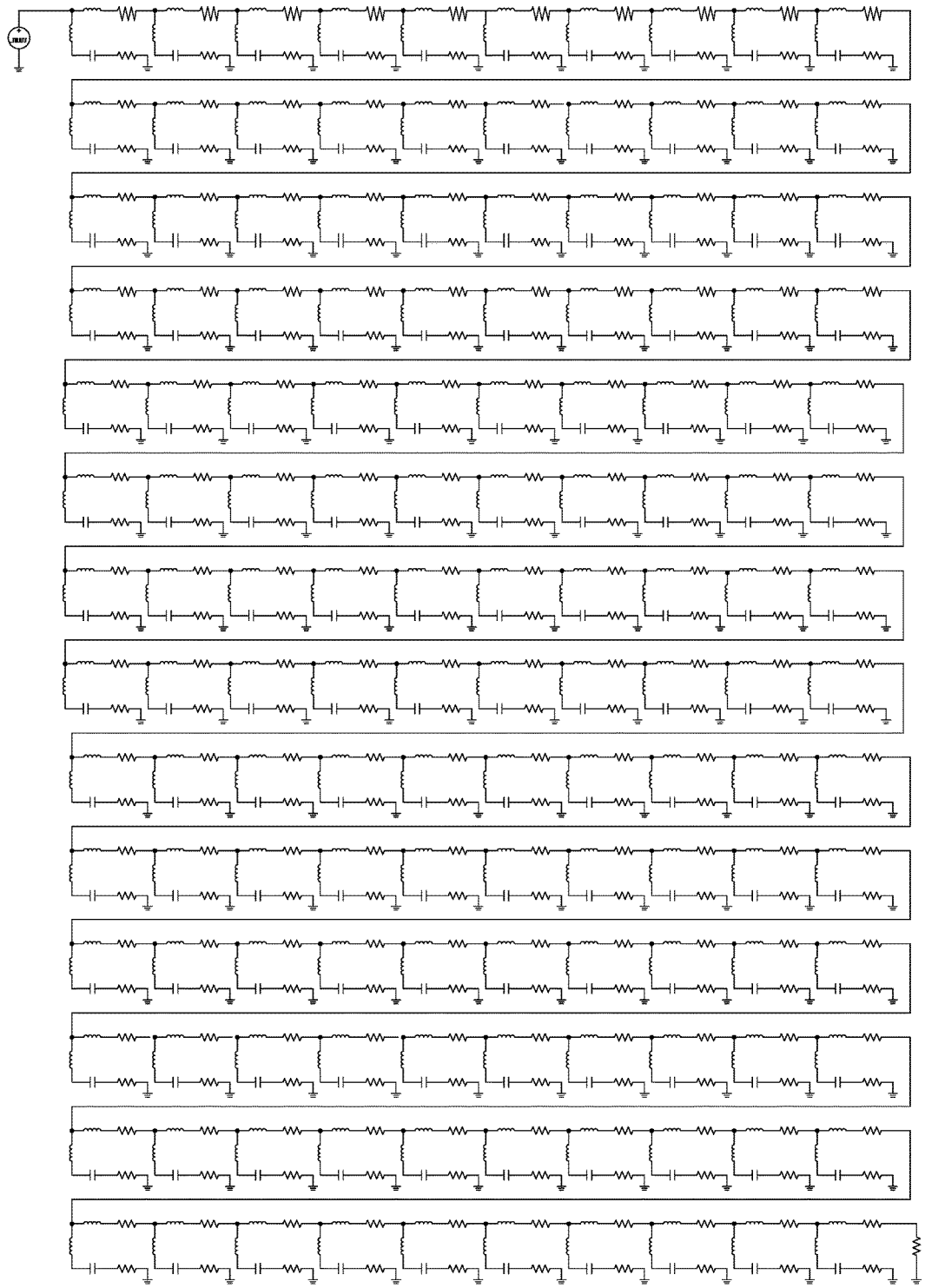
FIG. 7 is a circuit diagram of a nonlinear transmission line according to some embodiments.
Figure 8:
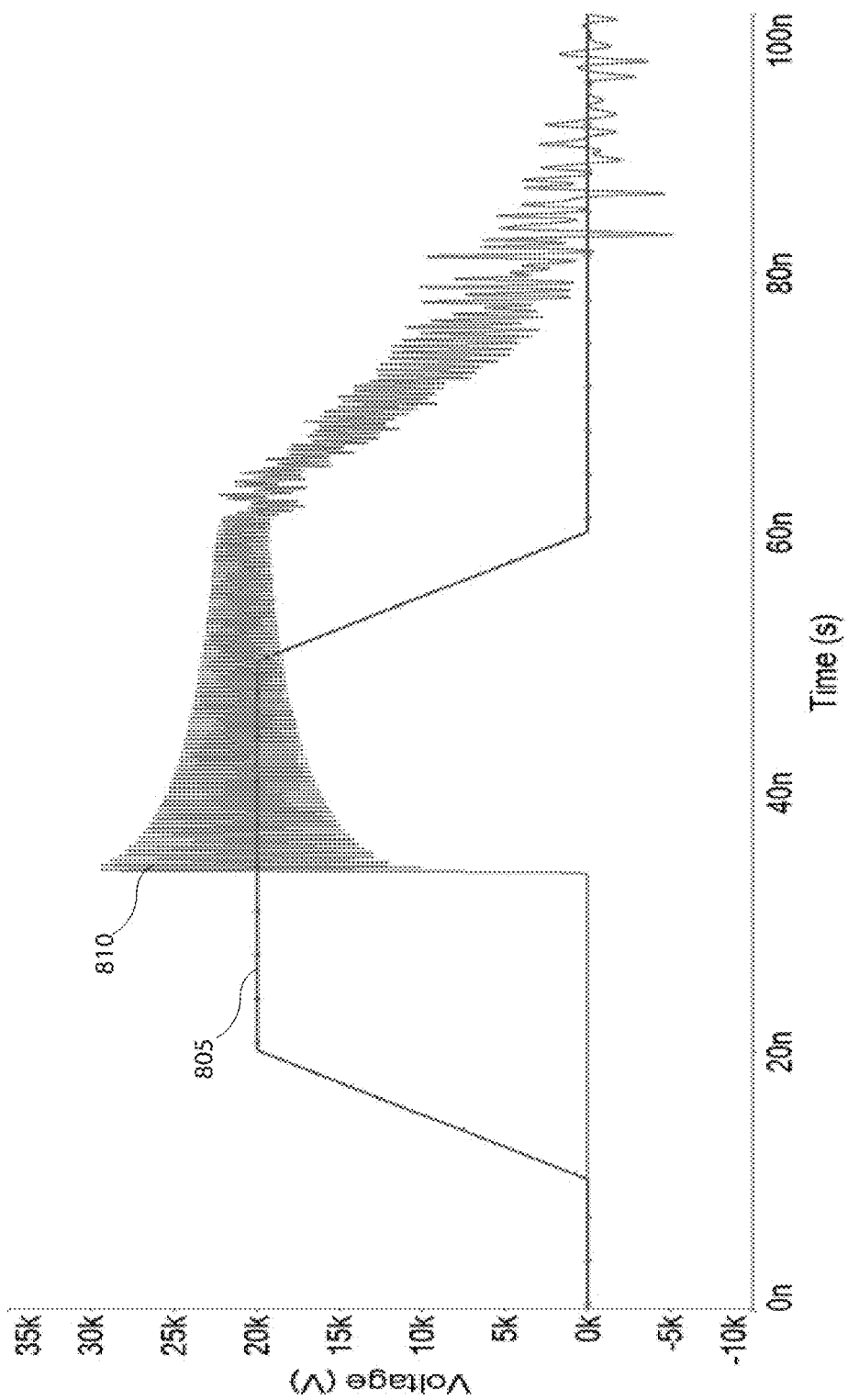
FIG. 8 is an input and output waveform of a nonlinear transmission line microwave generation device according to some embodiments.

FIG. 7 is a circuit diagram a nonlinear transmission line with 140 circuit elements according to some embodiments. FIG. 8 is a diagram of an input pulse 805 from a high voltage pulser 105 and an output pulse 810 after propagating through the nonlinear transmission line shown in FIG. 7. As shown in the diagram, the input pulse 805 is 20 kV pulse with a 60 ns flat top and a rise time of 10 ns. The output pulse is a high voltage signal with a frequency of 2.4 GHz. The various elements in the nonlinear transmission line in FIG. 7 may have the HF Values listed in the table above.

FIG. 5 and FIG. 7 illustrate two examples of nonlinear transmission lines have various component values. These values may vary based on implantation and/or design.

In some embodiments, a nonlinear transmission line can include a NSJC device (e.g., a Schottky diode) that has the following capacitance:

$$C_s = \frac{1}{n} \frac{C_{j0}}{\sqrt{1 + V_s/n\varphi}}$$

In some embodiments, the overall capacitance, $C_s$, of the nonlinear transmission line will decrease with increased number of diode (or NSJC device) sections n. $C_{j0}$ is the junction capacitance at zero voltage of a single diode, $\varphi$ is the junction potential and $V_s$ is the voltage across the nonlinear transmission line.

In some embodiments, as a general rule of thumb, in some conditions, the characteristic impedance of a nonlinear transmission line may be less than about 180 ohms. In some embodiments, the inductance of the nonlinear transmission line can be calculated, for example, to impedance match to 180Ω using the following formula, where $V_{40\%}$ is 40% of $V_{max}$:

$$Z = \sqrt{\frac{L}{C(V_{40\%})}}.$$

In some embodiments, the impedance of the nonlinear transmission line may vary as a function of the voltage applied and/or, for example, time, as the input pulse is applied.

Figure 9:
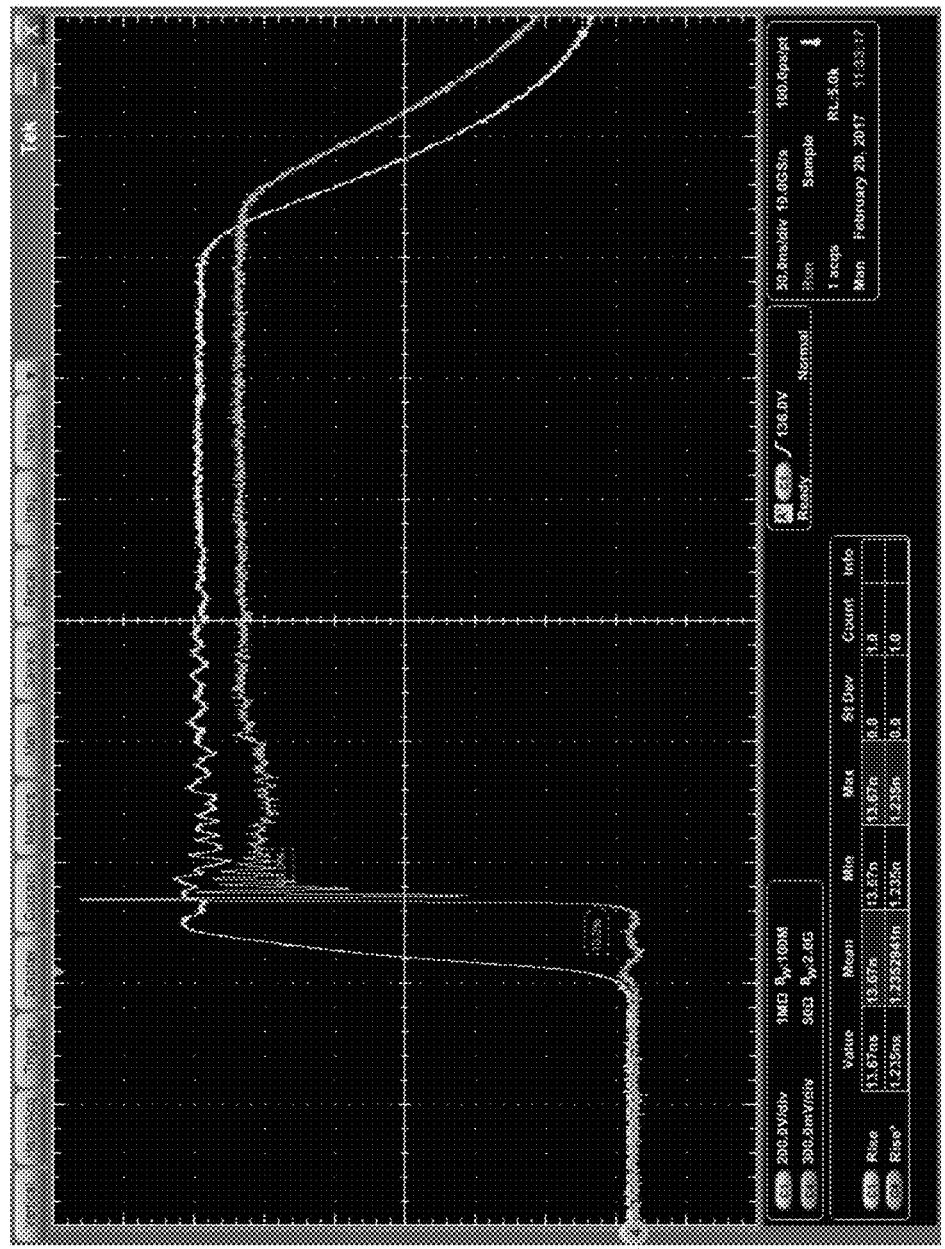
FIG. 9 is a diagram of an input pulse from a high voltage pulser and an output pulse after propagating through the nonlinear transmission line according to some embodiments.
Figure 10:
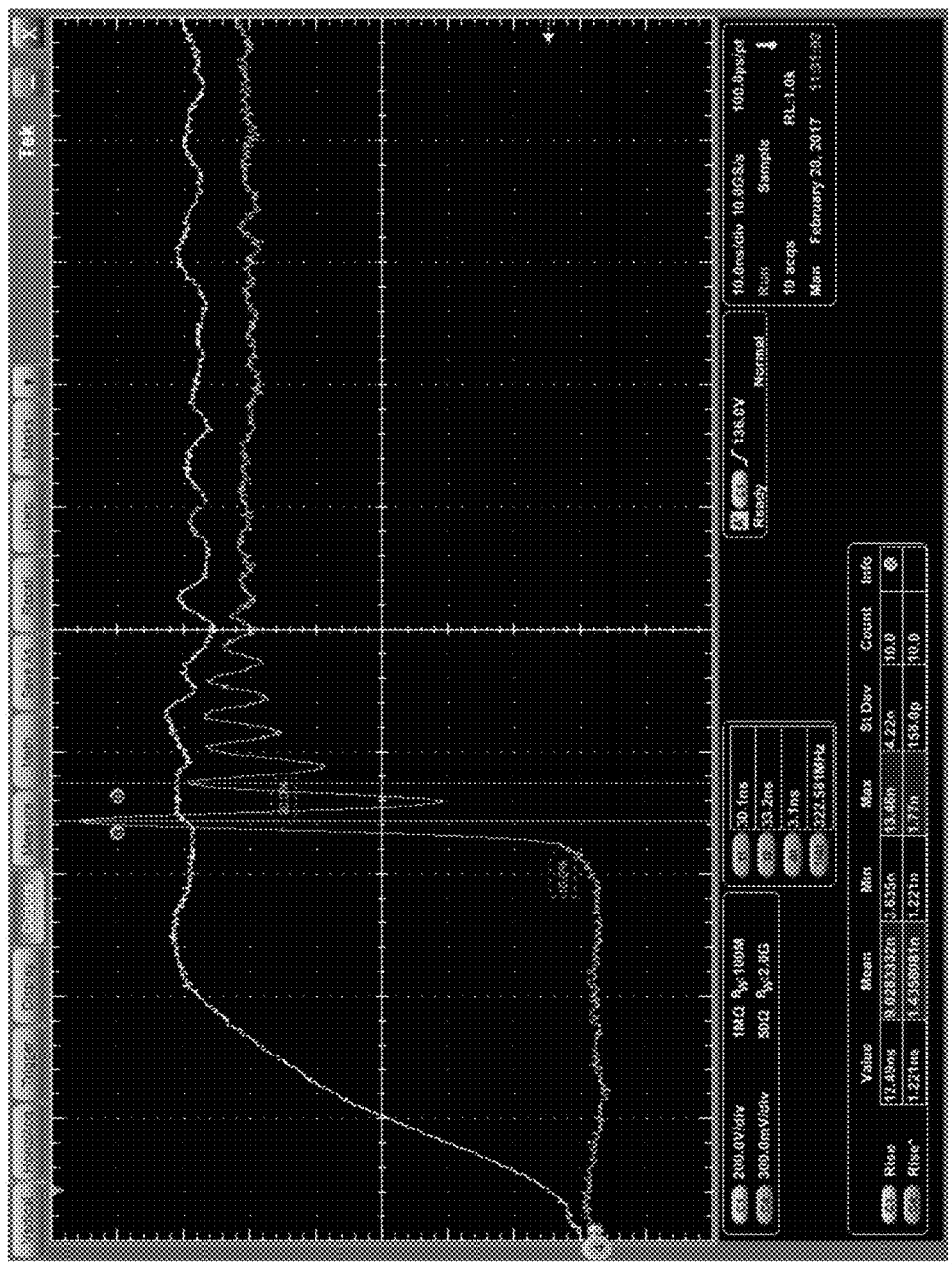
FIG. 10 is a zoomed in portion of the diagram shown in FIG. 9.

FIG. 9 is a diagram of an input pulse from a high voltage pulser and an output pulse after propagating through the nonlinear transmission line according to some embodiments. FIG. 10 is a zoomed in portion of the diagram shown in FIG. 9. In this example, the input pulse has a fast rise time (e.g., ~12.5 ns) and the output pulse has a faster front end rise time (e.g., ~1.2 ns). In this example, the output pulse has a frequency of 323 MHz oscillating at 6 kV.

The term "substantially" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A high voltage nonlinear transmission line comprising:
a high voltage input configured to receive electrical pulses having a first peak voltage that is greater than 5 kV;
a plurality of circuit elements electrically coupled with ground, each of the plurality of circuit elements includes a nonlinear semiconductor junction capacitance device and an inductor, wherein each of the plurality of circuit elements is electrically coupled with at least one adjacent one of the plurality of circuit elements; and
a high voltage output that oscillates at a frequency greater than 100 MHz about a voltage greater than 5 kV.

2. The high voltage nonlinear transmission line according to claim 1, wherein the high voltage output is coupled with an antenna.

3. The high voltage nonlinear transmission line according to claim 1, wherein each of the nonlinear semiconductor junction capacitance devices have a capacitance that changes nonlinearly with voltage.

4. The high voltage nonlinear transmission line according to claim 1, wherein the high voltage output provides a signal that has a second rise time that is faster than a first rise time of the high voltage input.

5. The high voltage nonlinear transmission line according to claim 1, wherein each of the plurality of inductors has an inductance less than about 500 nH.

6. The high voltage nonlinear transmission line according to claim 1, wherein each of the plurality of nonlinear semiconductor junction capacitance devices have an inductance less than about 100 nH.

7. The high voltage nonlinear transmission line according to claim 1, wherein the plurality of circuit elements comprises at least 30 circuit elements.

8. The high voltage nonlinear transmission line according to claim 1, wherein each of the nonlinear semiconductor junction capacitance devices comprises a plurality of nonlinear semiconductor junction capacitance devices arranged in parallel and/or series.

9. The high voltage nonlinear transmission line according to claim 1, wherein each of the plurality of nonlinear semiconductor junction capacitance devices have a capacitance at zero volts less than about 5 nF.

10. The high voltage nonlinear transmission line according to claim 1, wherein each of the plurality of nonlinear semiconductor junction capacitance devices comprise one or more diodes.

11. The high voltage nonlinear transmission line according to claim 1, wherein a stray inductance of each of the plurality of circuit elements is less than the inductance of the corresponding inductor of the respective circuit element.

12. A nonlinear transmission line comprising:
a high voltage input configured to receive electrical pulses having a first peak voltage that is greater than 5 kV having a first rise time;
a first nonlinear semiconductor junction capacitance device; and
a second nonlinear semiconductor junction capacitance device; and
a first inductor electrically coupled with the first nonlinear semiconductor junction capacitance device and the second nonlinear semiconductor junction capacitance device;
a third nonlinear semiconductor junction capacitance device; and
a second inductor electrically coupled with the second nonlinear semiconductor junction capacitance device and the third nonlinear semiconductor junction capacitance device;
a fourth nonlinear semiconductor junction capacitance device; and
a third inductor electrically coupled with the third nonlinear semiconductor junction capacitance device and the fourth nonlinear semiconductor junction capacitance device;
a fifth nonlinear semiconductor junction capacitance device; and a fourth inductor electrically coupled with the fourth nonlinear semiconductor junction capacitance device and the fifth nonlinear semiconductor junction capacitance device;

a high voltage output providing a high voltage output signal that oscillates at a frequency greater than 100 MHz about a voltage greater than 5 kV; and a fifth inductor electrically coupled with the fifth nonlinear semiconductor junction capacitance device and the high voltage output.

13. The nonlinear transmission line according to claim 12, wherein the high voltage output is coupled with an antenna.

14. The nonlinear transmission line according to claim 12, wherein the first inductor, the second inductor, the third inductor, the fourth inductor, and the fifth inductor have substantially the same inductance.

15. The nonlinear transmission line according to claim 12, wherein at least two of the first inductor, the second inductor, the third inductor, the fourth inductor, and the fifth inductor have different inductance.

16. The nonlinear transmission line according to claim 12, wherein the first nonlinear semiconductor junction capacitance device, the second nonlinear semiconductor junction capacitance device, the third nonlinear semiconductor junction capacitance device, the fourth nonlinear semiconductor junction capacitance device, and/or the fifth nonlinear semiconductor junction capacitance device each have a stray inductance less than about 100 nH.

17. The nonlinear transmission line according to claim 12, wherein the first inductor, the second inductor, the third inductor, the fourth inductor, and the fifth inductor each have an inductance less than about 500 nH.

\* \* \* \* \*